(12) United States Patent
Ohno et al.

(10) Patent No.: US 6,476,431 B1
(45) Date of Patent: Nov. 5, 2002

(54) FIELD EFFECT TRANSISTOR WITH BARRIER LAYER TO PREVENT AVALANCHE BREAKDOWN CURRENT FROM REACHING GATE AND METHOD FOR MANUFACTURING THE SAME

(75) Inventors: Yasuo Ohno, Tokyo (JP); Kensuke Kasahara, Tokyo (JP); Kazuaki Kunihiro, Tokyo (JP); Yuji Takahashi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/438,840

(22) Filed: Nov. 12, 1999

(30) Foreign Application Priority Data

Nov. 11, 1998 (JP) .......................................... 10-319704

(51) Int. Cl.[7] ..................... H01L 29/80; H01L 31/0328; H01L 31/0336; H01L 31/072; H01L 31/112
(52) U.S. Cl. ..................... 257/280; 257/192; 257/194; 257/195; 257/276
(58) Field of Search ............................... 257/328, 192, 257/194, 272, 276, 280, 281, 282, 283, 284, 285, 286, 195

(56) References Cited

FOREIGN PATENT DOCUMENTS

| JP | 64-81271 | 3/1989 | ................ 257/343 |
| JP | 7-131056 | 5/1995 | ................ 257/192 |

OTHER PUBLICATIONS

Sun et al., "Modeling of the On–Resistance of LDMOS, VDMOS, and VMOS Power Transistors", in IEEE Transactions on Electron Devices, pp. 356–358, Feb. 1980.

*Primary Examiner*—Steven Loke
(74) *Attorney, Agent, or Firm*—McGinn & Gibb, PLLC

(57) ABSTRACT

A p-type layer and an n-type layer which constitute a barrier layer are provided, and a leak of the holes at the time of the negative bias accompanying the p-type layer buffer required for the higher tolerance voltage is suppressed, and the discharge of the holes at the positive bias can be efficiently carried out. The tolerance voltage at the time of the OFF state is raised at the p-type layer buffer, and the tolerance voltage at the time of the ON state at the discharge of the holes is raised. Since no leak is generated from the p-type layer, the drain current is not lowered, and a higher output can be realized both in terms of the current and in terms of the voltage.

8 Claims, 4 Drawing Sheets

FIELD EFFECT TRANSISTOR WITH BARRIER LAYER TO PREVENT AVALANCHE BREAKDOWN CURRENT FROM REACHING GATE AND METHOD FOR MANUFACTURING THE SAME

BACKGROUND OF THE INVENTION

1. Field of the Invention

The present invention relates to a field effect transistor and a method for manufacturing the same, and more particularly to a structure of a device and a transistor which endures a high tolerance voltage and which allows a large amount of current to flow and a method for manufacturing the device or the transistor.

2. Description of the Related Art

As a device which has a high tolerance voltage such as silicon devices, there are known a VMOS (V-grooved Metal Oxide Semiconductor) transistor and a VDMOS (Vertical Double-diffused Metal Oxide Semiconductor) transistor which are referred to as a vertical structure type transistor, and a RESURF (Reduced Surface Field) structure transistor or an L-DMOS (Lateral Double-Diffused Metal Oxide Semiconductor) transistor which are referred to as a horizontal structure type transistor. These devices and transistors are described in the "Modeling of the On-Resistance of LDMOS, VDMOS and VMOS Power Transistors" (IEEE Trans. on Electron Devices, Vol. ED-27, p356), a document published by S. C. Sun and J. D. Plummer in 1980. These transistors are characterized in that they have a high concentration p-type layer under the gate and a region named a drift layer provided between the gate and the drain in addition to the normal transistor structure. On the drift layer, a channel comprising an n-type conductive, and a metal electrode fixed to the source potential in parallel with the channel are provided on the surface of the substrate via an oxide film, or a p-type layer is provided in the substrate.

A breakdown of the power-FET which is caused by a voltage exceeding a tolerance voltage is finally determined by the fact that an electron current further increases by a positive return such that an increase in the electron current, the generation of holes (positive holes) by avalanche breakdown, the excitation of electrons by the positive carrier (holes) allows a destructive current to flow. The p-type layer immediately under the gate works in the same way as the channel dope layer used for the suppression of the short channel effect with a fine MOSFET. As a consequence, the leak current decreases in the OFF state of the transistor, and the avalanche breakdown caused by the seed of this leak current is not generated so that the generation of the holes is suppressed. The effect of the p-type layer which decreases the seed current of the avalanche breakdown contributes conspicuously toward an improvement in the tolerance voltage.

Since no depletion layer spreads in the n-type layer at a low drain voltage in the drift layer, the channel of the n-type layer has a low resistance. On the other hand, a large bias is applied between the n-type layer, and the p-type layer or a metal electrode at a high drain voltage with the result that the n-type layer is depleted. As a consequence, the n-type layer can serve as a high resistor. When the n-type channel is completely depleted, a uniform electric field is applied in the direction of the channel so that no concentration of the electric field is generated. Consequently, the avalanche breakdown is hardly generated and a high-tolerance voltage is provided. When the drift layer is set to a five-pole tube mode, the same effect as the cuss code connection at the so-called two FET with the result that a high frequency characteristic is not damaged.

However, in a compound semiconductor power-FET, no such drift layer is provided. This is because the compound semiconductor has a high surface state level unlike silicon with the result that this surface state level serves as the same function as the p-type layer, and it was not required to actively introduce the p-type layer. However, since the surface state level which serves in the same way as the p-type layer is formed with the implantation of the negative carrier from the gate electrode, the length of the surface state level is definite. The length of the surface state level does not stand in proportion to the distance between the gate and the drain like the drift layer described above, and the tolerance voltage is limited to about 20V.

Thus, in order to enhance the tolerance voltage, an attempt has been made to introduce the p-type layer in the same manner as the silicon device for the suppression of the short channel effect and for an effective operation of the drift layer. In the case where a transistor is formed on the semi-insulation substrate, the p-type layer is surrounded with the semi-insulation substrate and the non-doped layer with the result that the p-type layer is electrically drifted. However, in the case where the generation of the holes at the avalanche breakdown is small in amount, the potential of the p-type layer leads to the formation of p-n junction with the n-type layer of the source and the drain. Thus, the source side with a low voltage constitutes a normal direction junction so that the potential of the p-type layer becomes approximately equal to the source potential. In such a case, with the same mechanism with the case of the MOSFET, the tolerance voltage has improved in the OFF state in which the drain current does not flow.

However, when the drain voltage is allowed to be increased in the ON state, a permanent breakdown which invites the thermal breakdown is generated at a relatively low voltage. The cause of the permanent breakdown can be described as follows. In other words, at a high voltage more than a certain degree accompanied by the flow of the drain current, the holes begin to be generated resulting from the avalanche breakdown. When the holes are accumulated in the vicinity of the channel, the positive voltage is generated which invites an increase in the drain current. As a consequence, the positive return of a current increase which has been described before is generated which leads to the permanent breakdown. When the current begins to flow through the FET, the electric field is concentrated on the drain end in a channel having a uniform doping with the result that the generation of a high electric field can not be avoided in the ON state. As a consequence, virtually no effect on the tolerance voltage is generated with the introduction of the p-type layer buffer which is drifting. Consequently, a high-tolerance voltage operation on the order of several hundred Volts which is obtained in the silicon MOSFET cannot be obtained.

Furthermore, actually, in the power-FET, B class or AB class operation amplifiers are used in many cases in order to realize a higher efficiency. In the case of such operation mode, the gate voltage in the half period of the input AC signal, the gate voltage will be lowered to a level lower than the level of the voltage at which the channel is temporarily cut off. When the gate voltage is lowered to a negative voltage, the n-type channel which constitutes a barrier of the holes is depleted and the p-type layer hole flows into the gate over the channel portion. On the other hand, an opposite bias is applied in the half period, but the holes are not implanted into the channel because the gate is a shot key electrode, and only the electrons of the channel flow into the gate. As a consequence, the flow of the holes as a whole is directed only in one direction with the result that the p-type layer holes is pulled out in a one-sided manner. In the case where the p-type layer is electrically drifted from the other electrode, the potential of the p-type layer is lowered. The drift current is lowered in the same manner as at the time when a negative substrate bias is applied with the result that a large electric power cannot be generated.

Furthermore, in the drifting p-type layer, a similar decrease in the drain current is generated in another mechanism. In the power-FET, the drain voltage is largely changed. As a consequence, the potential of the drifting p-type layer is oscillated with the capacity junction with the drain and the channel. In a normal state, as has been described above, the potential of the p-type layer is approximate to the source potential. However, when the central voltage changes centering on this potential, a voltage in the normal direction of the p-n junction and a voltage in the opposite direction thereof are applied between the n-type layer and the p-type layer of the source in an alternate manner. At the time of the bias in the normal direction, the p-type layer holes flow into the source. Otherwise, electrons flow into the p-type layer from the source with the result that the p-type layer is charged with negative electricity.

On the other hand, at the time when the opposite bias is applied, both the electrons and the holes do not move. As a consequence, the potential of the p-type layer is shifted in an increasing manner to the negative potential to be stabilized. The change is very slow as compared with a high frequency that is handled as a signal because such change occurs at the leak current of the p-n junction. As a consequence, it seems that a negative bias is applied to the substrate in terms of DC for the high frequency signal with the result that the drain current decreases and a large output cannot be obtained.

In this manner, the OFF tolerance voltage of the drifting p-type layer can be raised, but the drifting p-type layer has problems such as the generation of a positive bias resulting from the avalanche and the generation of the negative bias resulting from the charged pumping. These problems can be solved and prevented by fixing the potential of the p-type layer from the outside in the same manner as the MOSFET. For the solution of these problems, it is required to form a contact to the p-type layer from the surface or to use the p-type substrate. The increase in the steps and the deterioration in the high frequency characteristic cannot be avoided, but no measures can be taken about such problems.

However, in the case where the potential of the p-type layer is fixed, the holes of the p-type layer begin to flow out to the gate when an excessively large negative bias is applied to the gate in the B class operation with the result that a gate leak is generated. The gate leak leads to the generation of noises by the gate current, the change in the gate bias and in the substrate bias, an increase in the consumed power and the like. Only with respect to the suppression of the flow of the holes, there is provided a method using a large heterobarrier having a band gap. However, on the contrary, this method provides an adverse effect to the thermal permanent breakdown of the holes, which is generated in the avalanche breakdown. In other words, with respect to the p-type layer provided for the increase in the high tolerance voltage of the power-FET, excessive holes can be discharged to the source or the ground. Thus, in the case where a negative bias is applied to the gate, a barrier is provided which prevents the outflow of the holes to the gate.

FIG. 1 is a general model view showing a cross section of a power-FET having a structure free from the usage of a p-type layer buffer. In FIG. 1, a non-doped layer 7 is laminated on the semi-insulation substrate 8 and a channel n-type layer 6 is formed. Then, a source electrode 1 is provided via a high concentration n-type layer 4 of the source, and a drain electrode 3 is provided via a high concentration n-type layer 5 of the drain. Between the source electrode 1 and the drain electrode 3, a gate electrode 2 is provided. Between the gate electrode 2 and the drain electrode 3, a drift region 9 is provided. Incidentally, an explanation is made on the n-channel FET as an example here, but completely the same operation is carried out with the p-channel FET by inverting the p and n codes.

The structure shown in FIG. 1 is such that a substrate having a predetermined epitaxial structure is prepared, and an element is separated and prepared by selectively providing the channel n-type layer with the semi- insulation by means of the ion implantation of boron and oxygen. Symbol X in FIG. 1 denotes an ion implantation region. This structure is widely used in the GaAs power-FET, and the tolerance voltage is not improved unlike the MOSFET even when a distance between the gate and the drain is increased.

FIG. 2 is a view showing a structure in which an embedded p-type layer 10 is added to the structure shown in FIG. 1. In FIG. 2, like parts in FIG. 1 is denoted by like reference numerals. The embedded p-type layer 10 in FIG. 2 is surrounded by the semi-insulation substrate 8 and a nondoped layer 7 with the result that the embedded p-type layer 10 is electrically drifting. This structure has a problem that the potential of the embedded p-type layer 10 is negatively biased with the negative bias of the gate and the charged pumping phenomenon, and the drain current is lowered so that the power cannot be generated. This structure also has a disadvantage that the holes resulting from the avalanche breakdown invites an increase in the drain current, which tends to lead to a permanent breakdown.

FIG. 3 is a potential view in the direction of the cross section of the channel in the case where an excessively large negative bias is applied to the gate of the transistor of FIG. 2. At the same time, there is also shown a case in which the gate is set to the ON state.

In FIG. 3, reference numeral 15 denotes a conducted band in the case where the gate voltage is not applied thereto. Reference numeral 16 denotes a charged band in the case where the gate voltage is not applied thereto. Furthermore, reference numeral 17 denotes a conducted band in the case where a large negative bias is applied to the gate voltage. Reference numeral 18 denotes a charged band in the case where a large negative voltage is applied to the gate voltage. Incidentally, reference numeral 19 denotes channel electrons, and reference numeral 20 denotes holes.

In the case where a normal bias is applied to the gate, and the channel is set to the ON state, a zero bias or an opposite bias of the p-n junction is applied between the channel n region, and the buffer layer or the p-type layer of the substrate with the result that the electrons and holes are being separated. Consequently, the holes will not flow out to the gate electrode 2, the source electrode 1 and the drain electrode 3.

However, when the negative bias is applied to the gate, the electrons flow into the source electrode 1 or the drain electrode 3 with the result that the electron current is set to the OFF state and is stabilized. The holes are attracted to the direction of the gate electrode 2. When the gate bias is low, a barrier against the holes at the end of the p-type layer exists. However, the barrier soon disappears with a small gate bias. Then, as denoted by an arrow 21, the holes 20 begin to flow into the gate electrode 2. In the case of the MOSFET, there is a disadvantage in that the gate oxide film constitutes a barrier and the holes will not flow into the gate electrode 2, but the holes are accumulated in the interface thereby generating a cause of a parasitic capacity.

SUMMARY OF THE INVENTION

An object of the present invention is to provide a field effect transistor and a method for manufacturing the field effect transistor, the transistor being capable of improving the tolerance voltage of a drain either in the ON state or in the OFF state or in both states and realizing a high output FET by providing a buffer layer structure which constitutes a barrier with respect to the outflow of the holes at the time of the application of the negative bias of the gate in the power-FET in which the p-type layer is introduced into a portion underneath the channel, wherein the holes which are generated in the avalanche breakdown flow smoothly into the p-type layer and are discharged into the source or into the ground.

The field effect transistor according to the present invention includes a first conductive type channel layer, a second conductive type substrate, a first conductive type depletion semiconductor layer which is provided between the substrate and the channel layer, and a first conductive layer and a second conductive layer which are provided between the depletion semiconductor layer and the substrate to form a potential barrier. Then, the field effect transistor is characterized in that the potential barrier formed of the first conductive layer and the second conductive layer serves as a barrier for preventing the second conductive type carrier from flowing from the substrate in the direction of the gate electrode even in the case where an excessively large voltage is applied to the gate electrode which voltage is larger than the bias required for cutting off the channel of the channel layer described above.

Furthermore, a low concentration second conductive layer having a lower concentration than the second conductive layer and the substrate is provided between the second conductive layer provided between the depletion semiconductor layer and the substrate, and the substrate.

A method for manufacturing the field effect transistor according to the present invention is a method for manufacturing a field effect transistor having a first conductive type channel layer, the method comprising the steps of:

forming a second conductive layer on a second conductive type substrate;

forming a first conductive type layer on the second conductive type layer;

forming a non-doped layer on a first conductive type layer; and forming a channel layer on the non-doped layer;

wherein the first conductive type layer is depleted and a barrier against the second conductive type carrier is formed with the first conductive type layer and the second conductive type layer.

In the present invention, in order to attain the object described above, a structure is used in which a p-type layer, an n-type layer, a non-doped layer and a channel layer are laminated in order on the p-type substrate, the n-type layer is depleted, and at the same time, an impurity concentration and a thickness of each of the layers are set in such a manner that the barrier against the holes formed of the p-type layer and the n-type layer serves as a barrier even in the case where an excessively large negative voltage is applied to the gate. Furthermore, the structure is constituted in such a manner that a low concentration p-type layer is provided between the p-type layer and the p-type substrate, and the holes of the upper part p-type layer are depleted at a drain voltage on a certain degree. Otherwise, a p-type layer having a high concentration of $1 \times 10^{19}$ cm$^{-3}$ is provided on the p-type substrate. Otherwise, a semi-insulation or an insulation substrate are used in the place of the p-type substrate, and a high concentration p-type layer is provided thereon. In such a case, either a high concentration p-type layer is exposed to the surface and an electrode is provided, or a via hole is provided for connecting the source electrode and the rear surface of the substrate so that the via hole metal and a high concentration p-type layer directly come into contact with each other.

The barrier on which the p-type layer and the n-type layer are located adjacent to each other forms a potential distribution on the step and becomes a barrier having directivity respectively with respect to the electrons and the holes. Thus, the barrier provides a structure in which holes do not flow out from the p-type layer, but the inflow of the holes can not be prevented. Furthermore, the change in the potential of the p-type layer is prevented, and either the p-type substrate is used for discharging the holes, or an electrode is provided on the p-type layer with the result the potential is fixed. When a high concentration p-type layer having a concentration of $1 \times 10^{19}$ cm$^{-3}$ or more is used on a part of the p-type layer, an ohmic contact can be obtained with a tunnel effect only with the contact with the shot key metal. With these structures, the potential of the p-type layer is fixed, and, at the same time, the gate leak can be eliminated. Consequently, both in the OFF state and in the ON state, a device having a high-tolerance voltage can be realized.

DESCRIPTION OF THE PREFERRED EMBODIMENTS

Figure 1:
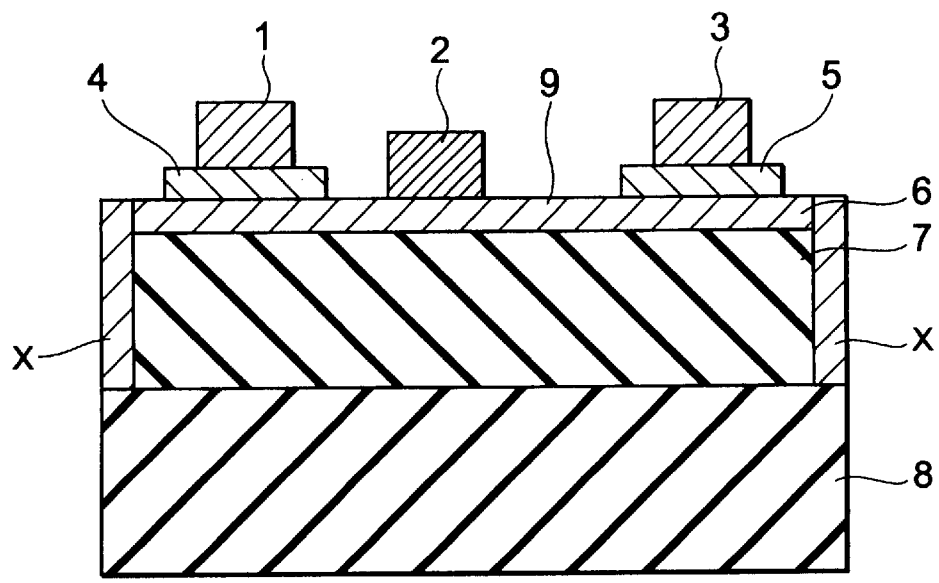
FIG. 1 is a model view showing a cross section of a GaAs power-FET having a conventional structure in which a p-type layer buffer is not used.
Figure 2:
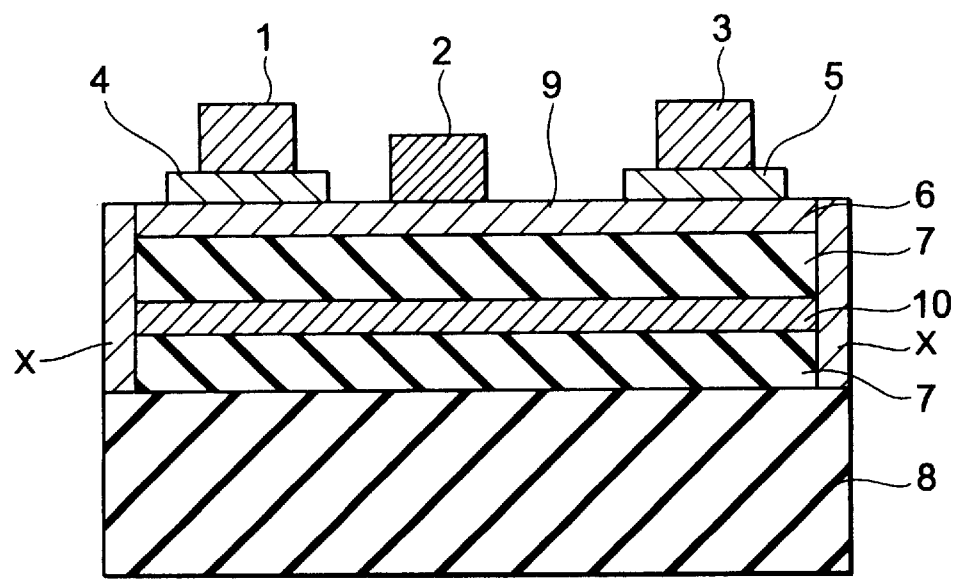
FIG. 2 is a model view showing a cross section of the GaAs power-FET in which the p-type layer buffer is used.

Next, preferred embodiments of the present invention will be explained by referring to the accompanied drawings. In each of the drawings which will be referred to in the following explanation, like parts in other drawings are denoted by like reference numerals. Incidentally, here, a case of an n-channel FET will be explained, but the same advantage can be provided in the case of the p-channel FET by replacing symbol p with symbol n.

Figure 4:
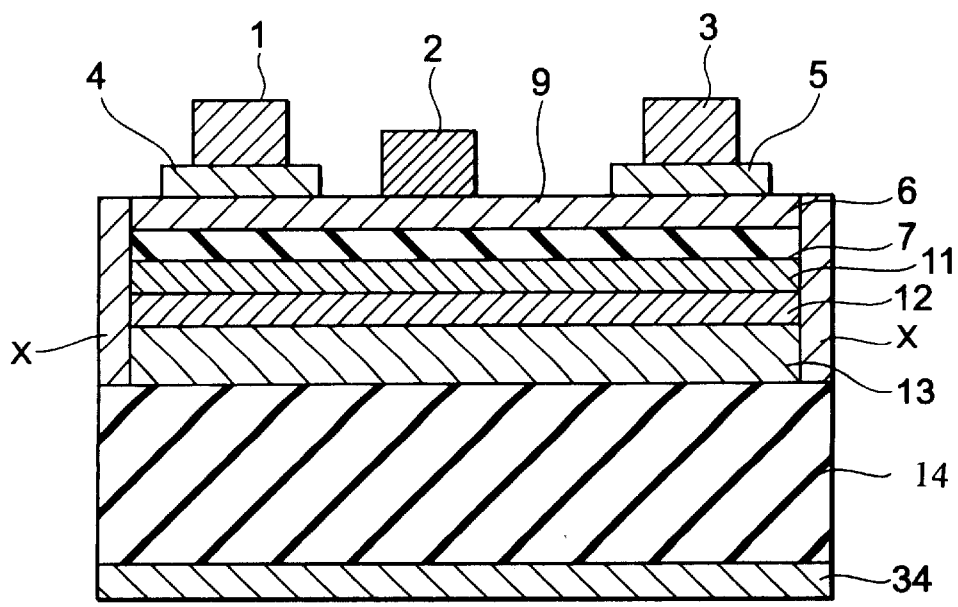
FIG. 4 is a model view showing a cross section of the GaAs power-FET according to the present invention.

FIG. 4 is a model view showing a cross section of a power-FET according to an embodiment of the present invention. In this structure, an n-type layer 11 is provided on a barrier p-type layer 12, and a barrier against the outflow of the holes toward the side of the gate is formed. Furthermore, under the p-type layer 12, a low concentration p-type layer 13 is provided, and is further connected to the p-type substrate 14. On the rear surface of the p-type substrate 14, a substrate electrode 34 formed of gold, tin or the like is formed. Through the substrate electrode 34, holes can be allowed to flow to the ground. Incidentally, it is desirable that the concentration of the acceptor of the p-type substrate is higher. The concentration thereof is on the order of $10^{17}$ to $10^{20}$ cm$^{-3}$.

Figure 3:
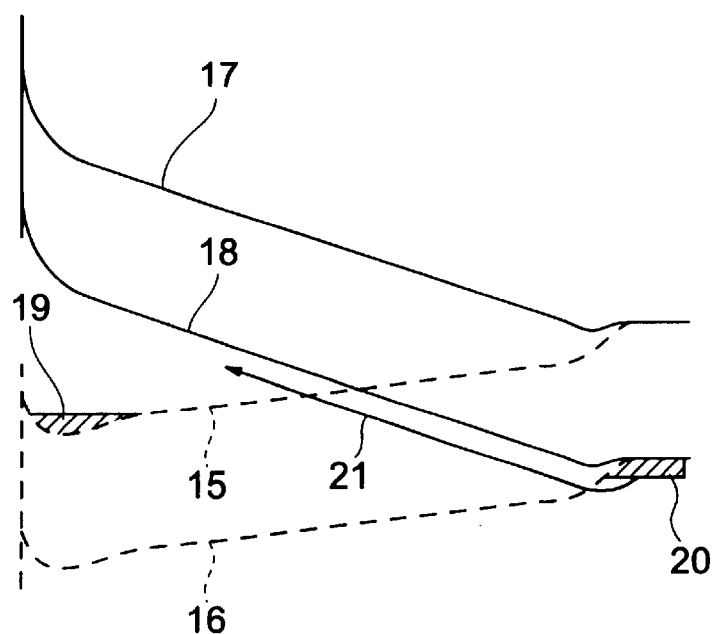
FIG. 3 is a potential model view in the direction of the cross section of the channel in the case where an excessively large negative bias is applied to the gate of the conventional type p-type layer buffer FET.
Figure 5:
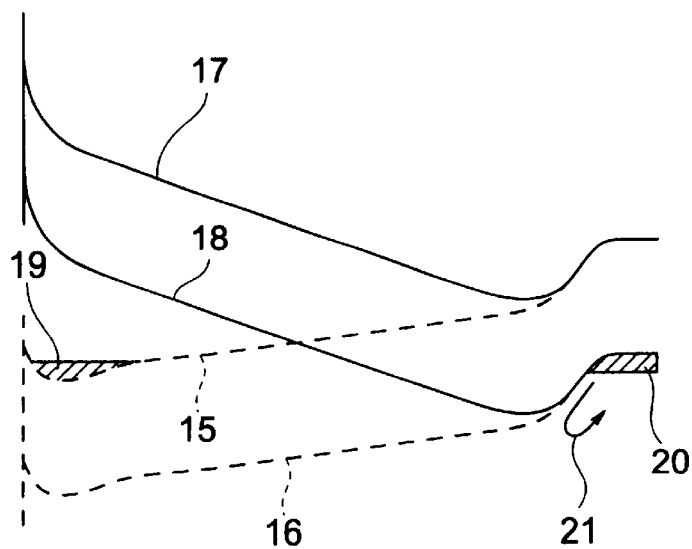
FIG. 5 is a potential model view in the direction of the cross section of the channel in the case where an excessively large negative bias is applied to the gate of the transistor having a barrier structure of the present invention.

FIG. 5 is a potential view in the direction of the cross section of the channel in the case where an excessively large negative bias is applied to the gate of the transistor of FIG. 4. It has been made clear that as compared with the case of FIG. 3 described above, the barrier against the outflow of the holes to the side of the gate is high, and the holes are not leaked as denoted by an arrow 21 even when the negative bias of the gate is relatively large.

Specifically, the barrier structure is determined by the concentration and the thickness of the p-type layer forming the barrier, the concentration and the thickness of the n-type layer, and a distance from the channel of the barrier layer. These elements can be determined in the way described below.

Figure 6:
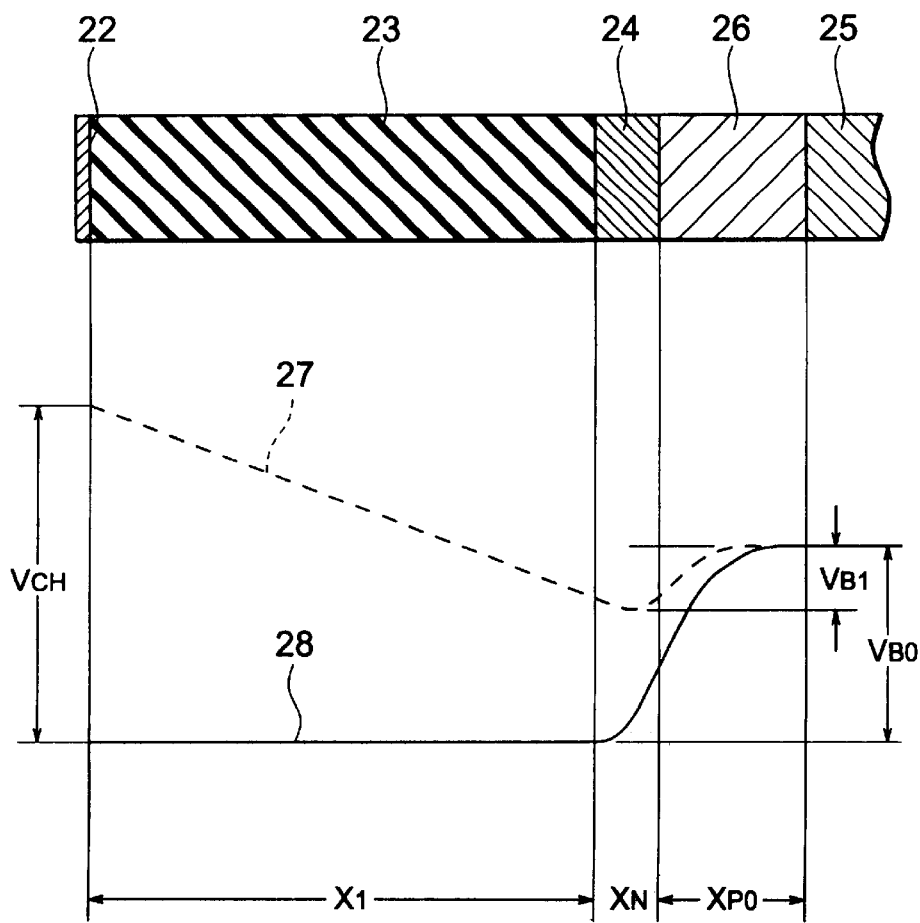
FIG. 6 is a view showing a structure of a model and a potential distribution for examining a relation between a structure parameter of a barrier structure of the present invention and a potential configuration thereof.

FIG. 6 is a view showing a structure of a cross section of a channel of a simplified power-FET. A non-doped layer 23 is provided between the channel 22 and the barrier layer described above. The thickness of the non-doped layer 23 is set to $X_I$. The barrier layer comprises a n-type layer 24 and a p-type layer 25. The n-type layer 24 is completely depleted to prevent a leak current between the source and the drain. It is presupposed that the p-type layer continues semi-permanently in this analysis. On a portion contacting the n-type layer 24, a depletion layer 26 (a depleted region in the p-type layer) spreads on the side of the p-type layer as well.

For the time being, the thickness of the n-type layer is set to $X_N$, a donor concentration thereof is set to $N_D$, an acceptor concentration of the p-type layer is set to $N_A$. The height of the barrier is defined with a difference in energy of the charged band in the carrier neutral region of the deep portion of the p-type layer, and the lowest energy of the charged band at the barrier portion. The height of the channel barrier (hereinafter referred to as a barrier height) at the time when the non-doped layer 23 is a flat band is set to $V_{BO}$. At this time, since the non-doped layer 23 becomes a flat band on both sides of the barrier layer, a negative carrier in the same amount with the total donor concentration $N_D \times X_N$ of the n-type layer 24 is generated on the side of the p-type layer 25 as a depletion layer 26 as seen from the Gauss' Principle. When the thickness of the depletion layer 26 at this time is set to $X_{PO}$, the mathematical expression 1 shown below is given.

$$X_{PO} = X_N \times \frac{N_D}{N_A} \quad (1)$$

The barrier height $V_{BO}$ can be defined in the following mathematical expression 2 by the addition of the potential on the side of the p-type layer and the potential on the side of the n-type layer.

$$V_{BO} = \frac{1}{2}\frac{q}{\varepsilon}(N_D X_N^2 + N_A X_{PO}^2) \quad (2)$$
$$= \frac{1}{2}\frac{q}{\varepsilon}N_D X_N^2 \left(1 + \frac{N_D}{N_A}\right)$$

The higher the barrier height is, the larger the advantage of stopping the holes becomes. However, the same barrier height is also present on the side of the conductive band. When the barrier height is too large, electrons are generated in the non-doped layer which causes a leak current. As a consequence, when the band-gap of the semiconductor is set to Eg, it is desirable that the barrier height $V_{BO}$ is given on a level on the order of (1/2)Eg. Through such a procedure, the condition can be satisfied such that electrons are depleted in the vicinity of the barrier which is presupposed in this calculation.

When the donor concentration ND and the acceptor concentration $N_A$ are determined from the mathematical expression 2, the thickness $X_N$ of the n-type layer is determined from the condition of the barrier height $V_{BO}$. In other words, the fact is represented in the following mathematical expression 3.

$$X_N = \sqrt{2V_{BO}\frac{q}{\varepsilon}\frac{N_A}{N_D(N_A + N_D)}} \quad (3)$$

Here, a case in which a negative voltage is applied to the gate will be examined. When the threshold value of the transistor is set to $-V_T$, the channel potential does not change because channel electrons connected to the source are present up to the threshold value of $-V_T$. As a consequence, when the negative bias is applied to a portion deeper than that, the potential of the non-doped layer is lowered from channel portion to the barrier portion with the potential of the p-type layer being applied thereto. The potential distribution in the case where the negative voltage is applied to this gate is denoted with a solid line 28 in FIG. 6. A difference in the channel potential between the case in which a negative voltage is applied (denoted with the solid line 28) and a case in which the negative voltage is not applied (denoted with the dashed line 27) will be set to $V_{CH}$.

When the scale of the electric field in the barrier portion is ignored simply because the potential change in the barrier portion is small, the following mathematical expression 4 is obtained.

$$\Delta E = -\frac{V_G - V_T}{X_I} \quad (4)$$

When the change in the strength of this electric field becomes equal to the electric field generated in a positive carrier of the n-type layer 24, the electric field becomes zero at the p-n junction portion, namely a flat band is provided with the result that a barrier to the holes disappears. The gate voltage $V_{GMAX}$ at that time will be represented in the following mathematical expression 5.

$$V_{GMAX} = V_T - \frac{q}{\varepsilon} X_I X_N X_D \qquad (5)$$

$$= V_T - X_I \sqrt{2V_{BO} \frac{q}{\varepsilon} \frac{N_A N_D}{N_A + N_D}}$$

Here, since the barrier height $V_{BO}$ is determined in advance, the donor concentration $N_D$ and the acceptor concentration $N_A$ can be arbitrarily selected. It has been made clear that both the donor concentration $N_D$ and the acceptor concentration $N_A$ are required to be set to large values at the same time in order to enlarge the gate voltage $V_{GMAX}$. A typical example of the donor concentration of the n-type layer, the acceptor concentration of the p-type layer, the thickness of the n-type layer, the thickness of the p-type layer depletion layer and the channel tolerance voltage is shown in Table 1.

TABLE 1

| Donor concentration of the n-type layer (cm$^{-3}$) | acceptor concentration of the p-type layer (cm$^{-3}$) | thickness of the n-type layer (nm) | thickness of the p-type layer depletion layer (nm) | tolerance voltage of the channel (V) |
| --- | --- | --- | --- | --- |
| 1.0E+17 | 1.0E+17 | 68.1 | 68.1 | 2.16 |
| 2.0E+17 | 2.0E+17 | 48.2 | 48.2 | 2.9 |
| 5.0E+17 | 5.0E+17 | 30.5 | 30.5 | 4.6 |
| 1.0E+18 | 1.0E+18 | 21.5 | 21.5 | 6.5 |
| 2.0E+18 | 2.0E+18 | 15.2 | 15.2 | 9.2 |

Here, the barrier height $V_{BO}$ is set to 0.7V on the presupposition of the value of GaAs, and the thickness $X_I$ of the non-doped layer is set to 200 nm. The tolerance voltage is a potential difference between the channel and the barrier in the case where the minimum value disappears to the charged band, and a potential difference between the gate and the gate is omitted. In the case of silicon, since the barrier height $V_{BO}$ is set to 0.55V, the thickness of the n-type layer becomes somewhat thin, and the tolerance voltage is also somewhat reduced. Furthermore, when the thickness $X_I$ of the non-doped layer is increased, the tolerance voltage also is increased in proportional to the increase in the thickness thereof. It has been made clear from this table that a p-type layer is required which has an acceptor concentration same as the n-type layer with a donor concentration of $10^{18}$ cm$^{-3}$ and a thickness of about 20 nm in the case where a negative voltage of several volts are applied to the gate.

In the explanation given so far, it has been shown that the holes do not flow out from the substrate in the direction of the gate. It is apparent from each of the potential views that the holes flow into the p-type layer of the substrate in a smooth manner in the case where the channel side is set to a positive bias, and the avalanche breakdown is generated in the holes. In the case of hetero-barrier both directions constitute a barrier with the result that the holes do not flow into the substrate in a smooth manner which causes a failure of the tolerance voltage in the ON state.

One of the significance of the p-type substrate is the excitation and the depletion of the channel electrons. In order to lower the drain resistance, it is more favorable that a distance with the channel is shorter. However, in the case where a positive voltage is applied to the drain electrode, an electric field is also applied to the vertical direction of the channel with the result that the channel can be hardly allowed to come close to the p-type substrate. In order to avoid the tolerance voltage breakdown in the vertical direction, the p-type layer is depleted one time at a certain degree of the electric field with the result that a voltage is applied to the next p-type layer located at a rear portion.

It is favorable that the drain resistance is raised to a higher level once the channel is pinched off. Favorably, the device is designed in such a manner that the first p-type layer is depleted when the pinched-off voltage of the channel is exceeded. Since the thickness of the p-type layer in Table 1 corresponds to the thickness of the depletion layer at the low drain bias, the device is designed in such a manner that the thickness of the p-type layer is increased with the result that the layer is depleted at a predetermined drain voltage. However, when a resistor is located between the p-type layer of the barrier and the substrate, a trouble is caused to the discharge of the hole. Therefore, a low concentration p-type layer is inserted which does not largely affect the potential distribution but which has a low resistance with respect to the holes. Since the p-type layer of the barrier has a concentration on the order of $10^{18}$ cm$^{-3}$, a concentration of $10^{17}$ cm$^{-3}$, which is about 1/10 thereof is desirable.

In order to efficiently pull out the holes, an ohmic electrode with respect to the holes is formed on these p-type layers. Since the rear surface as a whole can be used, a resistor is not required which has a relatively large area and an extremely low resistance. However, in the case where the via hole electrode is used which passes through the surface of the contact to the p-type layer and through the substrate, a high concentration layer having a concentration of $10^{19}$ cm-3 or more may be favorably grown in contact with the substrate. For this growth of the high concentration layer, particularly a precise concentration control is not required, and the high concentration layer can be realized with the MBE (Molecular Beam Epitaxy) and the MOCVD (Metal Organic Chemical vapor Deposition).

Figure 7:
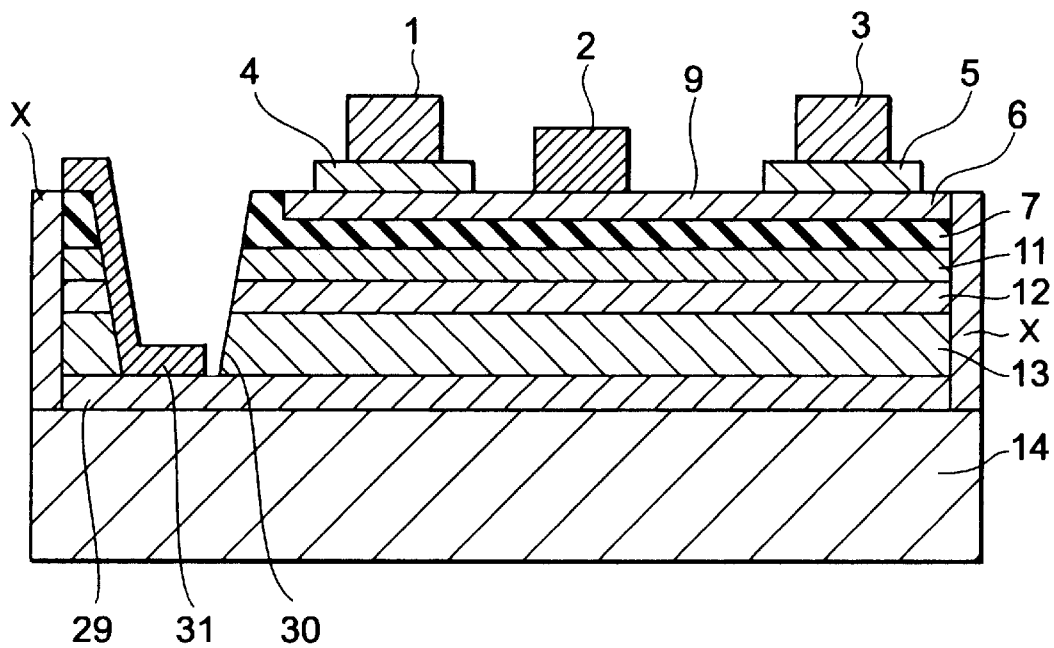
FIG. 7 is a model view showing a cross section of an example in which a p-type layer having a high concentration is grown on the surface of the substrate, and an ohmic electrode is provided on the surface of this p-type layer.

FIG. 7 is a view showing an example in which a high concentration p-type layer 29 is grown on the surface of the substrate 14, a contact hole 30 is provided after the device is prepared, and the surface of the p-type layer 29 is selectively exposed and an electrode 31 which constitutes the ohmic electrode is provided. It is desirable that the concentration of the p-type layer is set to $10^{19}$ cm$^{-3}$ or more, and the thickness is set to a thickness thick as much as possible in order to lower the resistance. However, the thickness is set to 1 micron because of the limit on the growth speed. An alloy of Ti and Au is used as a metal. Since the concentration of the p-type layer is high, the limit is small. Through such a procedure, the advantage of the barrier layer which has been described above can be obtained with the semi-insulation substrate in the place of the p-type layer.

Figure 8:
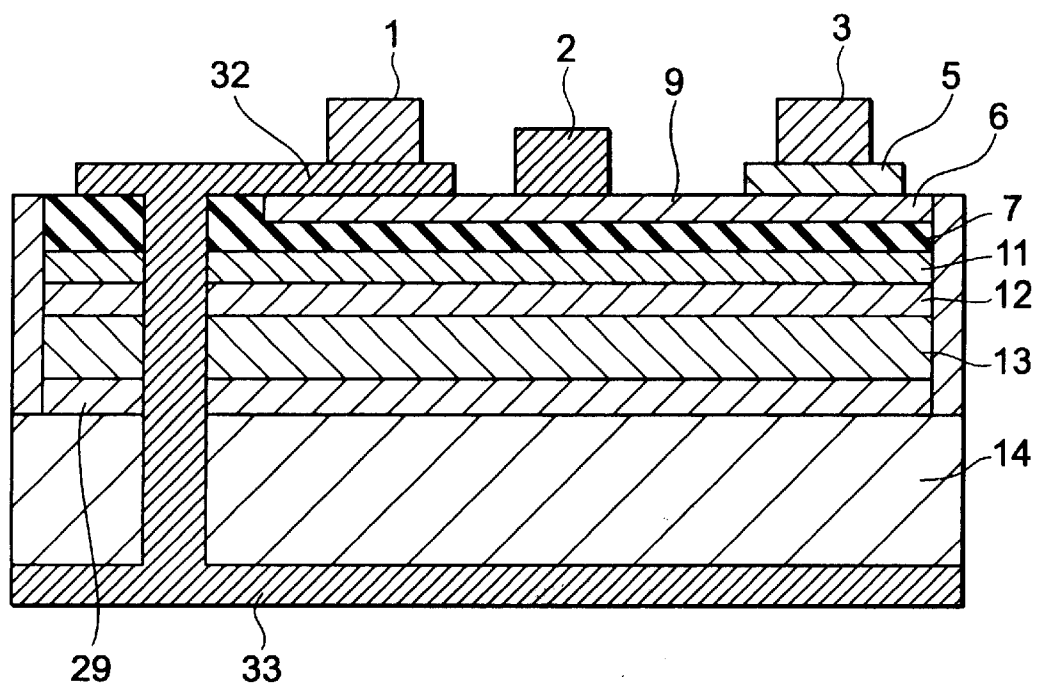
FIG. 8 is a view showing an example in which a high concentration p-type layer is grown on the surface of the substrate, and a via hole electrode is formed thereon.

FIG. 8 is a view showing an example in which via hole electrode is formed on the substrate having the same structure. The high concentration p-type layer 29 and the gold in the via hole 33 comes into contact with each other in the substrate so that an ohmic contact can be automatically obtained. Through such a procedure, an excessive step of exposing the p-type layer 29 is not required with the result that an ohmic contact to the p-type layer 29 can be formed in the via hole step which has been conventionally carried out. Incidentally, reference numeral 32 in FIG. 8 denotes a source and a via hole electrode.

As has been described, when the barrier layer described above is used in the field effect transistor, the leak of the holes at the time of the negative bias accompanying the p-type layer buffer which is required for an increase in the tolerance voltage is suppressed. In addition, the holes at the time of the positive bias can be efficiently discharged. As a consequence, the tolerance voltage at the time of the OFF state is raised at the p-type layer buffer, the tolerance voltage at the time of the ON state is raised in the discharge of the holes. Furthermore, since no leak is generated from the p-type layer, the drain current is not lowered with the result that a higher output can be generated both in terms of the current and in terms of the voltage.

So far, the explanation is given on the presupposition of the GaAs MESFET. The same advantage can be provided with respect to the HEMT (High Electron Mobility Transistor) structure. Furthermore, in the MOSFET free from the gate leak, the leak of the holes from the p-type layer causes a parasitic capacity at the time of the negative bias of the gate with the result that the same advantage can be provided as well.

The field effect transistor that has been described above can be manufactured by laminating on the p-type substrate 14 a p-type layer 12, an n-type layer 11, a non-doped layer 7, and a channel layer 6 in this order. Then, the n-type layer 11 is depleted at this time, and, at the same time, the impurity concentration, and the thickness of each of the layers are set so that a barrier formed of the p-type layer 12 and the n-type layer 11 against the holes functions as a barrier even in the case where an excessively large negative voltage is applied to the gate.

Furthermore, as shown in FIG. 4, a low concentration p-type layer 13 is provided between the p-type layer 12 and the p-type substrate 14 with the result that the holes in the upper part p-type layer are depleted at a certain degree of the drain voltage. Furthermore, as shown in FIGS. 7 and 8, a high concentration p-type layer 29 having a concentration of $1 \times 10^{19}$ cm$^{-3}$ or more is provided on the p-type substrate 14. In the place of the p-type substrate 14, a semi-insulation substrate, and an insulation substrate may be used, and the high concentration p-type layer 29 may be provided on the semi-insulation substrate, and the insulation substrate. In such a case, the high concentration p-type layer 29 is exposed to the surface, and either the electrode 31 or the via hole 33 for connecting the source electrode and the rear surface of the substrate is provided with the result that the metal of the via hole 33 and the high concentration p-type layer 29 come into a direct contact with each other.

When the field effect transistor is manufactured in this manner, a structure can be realized such that the barrier on which the p-type layer 12 and the n-type layer 11 are located adjacent to each other forms a potential distribution on the step, and constitute a barrier of directivity with respect to the carriers, namely the electrons and the holes respectively with the result that the holes do not flow out from the p-type layer 12 but the inflow of the holes cannot be prevented. Furthermore, either the p-type substrate is used or an electrode is provided on the p-type layer 12 to fix the potential in order to prevent the change in the potential of the p-type layer 12 and to discharge the holes. When a high concentration p-type layer 13 having a concentration of $1 \times 10^{19}$ cm$^{-3}$ or more is used in a part of the p-type layer, an ohmic contact can be obtained with the tunnel effect only by allowing the high concentration p-type layer 13 to contact with the shot key metal. With the adoption of such a structure, the potential of the p-type layer is fixed, and the gate leak ceases to be present with the result that a device having a high tolerance voltage can be obtained both in the OFF state and in the ON state.

In this manner, the present invention has an advantage in that the leak of the holes at the time of the negative bias accompanying the p-type layer buffer required for the higher tolerance voltage can be suppressed by providing a barrier layer, and the discharge of the holes at the time of the positive bias can be efficiently carried out, the tolerance voltage at the time of the OFF state at the p-type buffer is raised, and the tolerance voltage at the time of the ON state at the discharge of the holes is raised, and the drain current is not lowered because of the absence of the leak from the p-type layer, and a higher output can be realized both in terms of the current and in terms of the voltage.

What is claimed is:

1. A field effect transistor, comprising:

a gate electrode;

a first conductive type channel layer;

a second conductive type substrate;

a first conductive type layer, which is provided between the second conductive type substrate and the first conductive type channel layer, and which is depleted; and a second conductive type layer, the first conductive type layer and the second conductive type layer, which are provided between the first conductive type channel layer and the second conductive type substrate, forming a potential barrier, wherein the potential barrier formed by the first conductive type layer and the second conductive type layer serves as a barrier for preventing a second conductive type carrier from flowing out of the second conductive type substrate in a direction of the gate electrode even when a large voltage is applied to the gate electrode, the large voltage being larger than a bias voltage required for cutting off a channel of the first conductive type channel layer.

2. The field effect transistor according to claim 1, further comprising a low impurity concentration second conductive type layer provided between the second conductive type layer and the second conductive type substrate and having an impurity concentration lower than the second conductive type layer and the second conductive type substrate.

3. The field effect transistor according to claim 1, further comprising;

an ohmic electrode;

a high impurity concentration second conductive type layer which is formed on the second conductive type substrate, comprises an impurity concentration of $10^{19}$ cm$^{-3}$ or more, and is connected to the ohmic electrode; and a contact hole, extending from a non-doped layer or the first conductive type channel layer to the high impurity concentration second conductive type layer, in which the ohmic electrode is formed.

4. The field effect transistor according to claim 1, further comprising:

an ohmic electrode;

a via-hole in which the ohmic electrode is formed;

a high impurity concentration second conductive type layer which is formed on the second conductive type substrate, comprises an impurity concentration of $10^{19}$ cm$^{-3}$ or more, and forms an ohmic contact with the ohmic electrode;

a first electrode formed on a rear surface of the second conductive type substrate which is electrically connected to the ohmic electrode; and a second electrode formed above the first conductive type channel layer which is electrically connected to the ohmic electrode and a source of the field effect transistor.

5. A field effect transistor, comprising:

a gate electrode;

a first conductive type channel layer;

an insulation substrate;

a first conductive type layer, which is provided between the insulation substrate and the first conductive type channel layer, and which is depleted;

a second conductive type layer, the first conductive type layer and the second conductive type layer, which are provided between the first conductive type channel layer and the insulation substrate, forming a potential barrier;

a high impurity concentration layer of a second conductive type, which is formed on the insulation substrate and comprises an impurity concentration of $10^{19}$ cm$^{-3}$ or more; and an ohmic electrode connected to the high impurity concentration layer of the second conductive type, wherein the potential barrier formed by the first conductive type layer and the second conductive type layer serves as a barrier for preventing a second conductive type carrier from flowing out of the insulation substrate in a direction of the gate electrode, even when a large voltage is applied to the gate electrode, the large voltage being larger than a bias voltage required for cutting off a channel of the first conductive type channel layer.

6. A field effect transistor, comprising:

a second conductive type substrate;

a low concentration second conductive type layer formed on and having an impurity concentration lower than the second conductive type substrate;

a second conductive type layer formed on and having an impurity concentration greater than the low concentration second conductive type layer;

a first conductive type layer which is depleted and is formed on the second conductive type layer;

a non-doped layer formed on the first conductive type layer;

a first conductive type channel layer formed on the non-doped layer;

a gate electrode formed on the first conductive type channel layer; and a source electrode and a drain electrode, each formed on high concentration first conductive type layer having an impurity concentration greater than the first conductive type channel layer, wherein a potential barrier is formed by the first conductive type layer and the second conductive type layer that prevents a second conductive type carrier flow from the second conductive type substrate to the first conductive type channel layer.

7. The field effect transistor according to claim 6, further comprising;

an ohmic electrode;

a high impurity concentration second conductive type layer which is formed on the second conductive type substrate, comprises an impurity concentration of $10^{19}$ cm$^{-3}$ or more, and is connected to the ohmic electrode; and a contact hole, extending from the non-doped layer or the first conductive type channel layer to the high impurity concentration second conductive type layer, in which the ohmic electrode is formed.

8. The field effect transistor according to claim 6, further comprising:

an ohmic electrode;

a via-hole in which the ohmic electrode is formed;

a high impurity concentration second conductive type layer which is formed on the second conductive type substrate, comprises an impurity concentration of $10^{19}$ cm$^{-3}$ or more, and forms an ohmic contact with the ohmic electrode;

a first electrode formed on a rear surface of the second conductive type substrate which is electrically connected to the ohmic electrode; and a second electrode formed above the first conductive type channel layer which is electrically connected to the ohmic electrode and a source of the field effect transistor.

* * * * *